United States Patent [19]

Williams

[11] Patent Number: 5,067,218

[45] Date of Patent: Nov. 26, 1991

[54] VACUUM WAFER TRANSPORT AND PROCESSING SYSTEM AND METHOD USING A PLURALITY OF WAFER TRANSPORT ARMS

[75] Inventor: Owen P. Williams, Phoenix, Ariz.

[73] Assignee: Motorola, Inc., Schaumburg, Ill.

[21] Appl. No.: 526,255

[22] Filed: May 21, 1990

[51] Int. Cl.⁵ ............... H01L 21/30; H01L 21/46; H01L 21/50; C23C 14/56
[52] U.S. Cl. ............... 29/25.01; 414/217; 414/221; 118/719; 118/729
[58] Field of Search ............ 414/217, 221; 29/722, 29/742, 759, 25.01; 118/729, 719

[56] References Cited

U.S. PATENT DOCUMENTS 3,404,661  8/1965  Mathias et al. ............... 414/217
4,498,416  2/1985  Bouchaib et al. ............... 414/217
4,643,627  2/1987  Bednorz et al. ............... 414/217
4,664,062  5/1987  Kamohara et al. ............... 118/719
4,923,584  5/1990  Bramhall, Jr. et al. ............... 414/217

Primary Examiner—Robert Kunemund
Assistant Examiner—David E. Graybill
Attorney, Agent, or Firm—Harry A. Wolin

[57] ABSTRACT

A vacuum wafer transport and processing system and method includes a central vacuum chamber having wafer holding means disposed therein. A plurality of wafer transport arms are disposed between the central vacuum chamber and a plurality of wafer process chambers. The wafer transport arms transport wafers between the various process chambers and the central vacuum chamber so that multiple processing steps may be performed in a vacuum.

21 Claims, 2 Drawing Sheets

# VACUUM WAFER TRANSPORT AND PROCESSING SYSTEM AND METHOD USING A PLURALITY OF WAFER TRANSPORT ARMS

BACKGROUND OF THE INVENTION

This invention relates, in general, to semiconductor device processing, and more particularly to a vacuum wafer transport and processing system and method.

The processing of semiconductor wafers to fabricate devices and integrated circuits requires numerous steps in various types of reactors and process chambers. The wafers being processed are commonly moved from chamber to chamber manually. The manual transportation of the wafers subjects them to particulates and other impurities. The particulates and other impurities result in increased defect density and lower quality devices.

Cluster tools such as the Applied Materials Model 5000 are capable of performing multiple process steps without breaking vacuum. This greatly reduces the exposure of wafers to the atmosphere as well as manual wafer handling. A typical cluster tool includes a central transport module to which multiple process modules are coupled. The transport module includes a single robotic arm which transports wafers between the transport module and the various process modules. When a wafer has been transported into a specific process module, the process module is sealed from the transport module and processing takes place therein. The vacuum pressure of the process module may be the same or different than the vacuum pressure of the transport module depending upon the specific processing step.

Cluster tools are severely limited by their design, namely the presence of only a single robotic arm to transport wafers between the transport module and various process modules. First, since all wafer transport is dependent upon a single robotic arm, throughput is restricted. Second, the entire operation of the cluster tool is entirely dependent upon the robotic arm. If the arm malfunctions, the entire system becomes inoperative until the arm is repaired.

Accordingly, it would be highly desirable to have a vacuum wafer transport and processing system that would allow for higher throughout and not be dependent upon a single robotic arm.

SUMMARY OF THE INVENTION

Accordingly, it is an object of the present invention to provide an improved vacuum wafer transport and processing system that is capable of performing multiple processing steps under a continuous vacuum.

Another object of this invention is to provide a vacuum wafer transport and processing system that allows for increased throughput.

It is an additional object of the present invention to provide a vacuum wafer transport and processing system that is not dependent upon the operation of a single robotic arm.

The foregoing and other objects and advantages are achieved in the present invention by one embodiment in which, as a part thereof, includes a central vacuum chamber having wafer holding means disposed therein. A plurality of wafer transport arms are coupled to and extend from the central vacuum chamber. At least some of the plurality of wafer transport arms are further coupled to wafer process chambers. These wafer transport arms transport wafers between wafer holding means in the central vacuum chamber and various wafer process chambers. Additonally, other wafer transport arms may be used for storage and the like. The present invention may also include wafer transport arms that transport wafers directly between various wafer process chambers.

A more complete understanding of the present invention can be attained by considering the following detailed description in conjunction with the accompanying drawings.

DETAILED DESCRIPTION OF THE INVENTION

Figure 1:
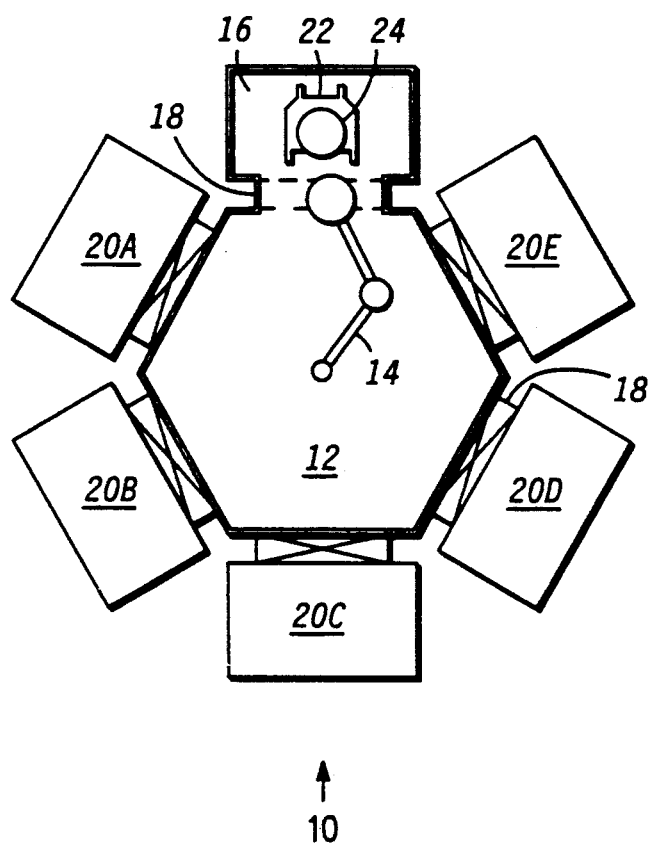
FIG. 1 is a schematic view of a prior art cluster tool.

FIG. 1 is a schematic view of a prior art cluster tool 10 similar to an Applied Materials Model 5000. Cluster tool 10 includes a transport module 12 having a single robotic arm 14 disposed therein. A cassette module 16 is coupled to transport module 12 by a gate valve 18. A plurality of process modules 20A-20E are also coupled to transport module by gate valves 18.

Cluster tool 10 generally operates as follows. A wafer cassette 22 including wafers 24 is disposed in cassette module 16. While wafer cassette 22 is being placed in cassette module 16, gate valve 18 coupling cassette module 16 to transport module 12 is sealed so that transport module 12 is not exposed to the atmosphere. Once wafer cassette 22 has been loaded into cassette module 16, cassette module 16 is sealed from the atmosphere and is pumped down to a specified vacuum pressure. Typically, the vacuum pressure of cassette module 16 is the same as that of transport module 12. Once cassette module 16 has reached the desired vacuum pressure, gate valve 18 is opened and robotic arm 14 transports wafer 24 from cassette 22 into transport module 12 through gate valve 18.

Once wafer 24 has been disposed in transport module 12 by robotic arm 14, it is further transported into one of the various process modules 20A-E. The gate valve 18 coupling the specific process module 20 to transport module 12 is then sealed and the process module 20 may be pressurized to the specific vacuum or pressure required for the processing step. It should be understood that each of process modules 20A-E may be pumped to pressures different than that of transport module 12. Once the process step has been completed, gate valve 18 opens and robotic arm 14 retrieves wafer 24 from the specific process module 20 and returns it to transport module 12. Wafer 24 may then be placed into another process module 20 to be further processed.

Although cluster tool 10 allows for multiple processing steps to occur in a vacuum and therefore less subject to particulates and other impurities, it is also relatively inefficient. Because only a single robotic arm 14 is disposed in transport module 12, only limited numbers of wafers 24 may be transported in a given time and therefore, throughput is relatively slow. Further, the entire operation of cluster tool 10 depends on robotic arm 14. If robotic arm 14 malfunctions or breaks, cluster tool 10 is basically inoperative because wafers 24 cannot be transported therethrough.

Figure 2:
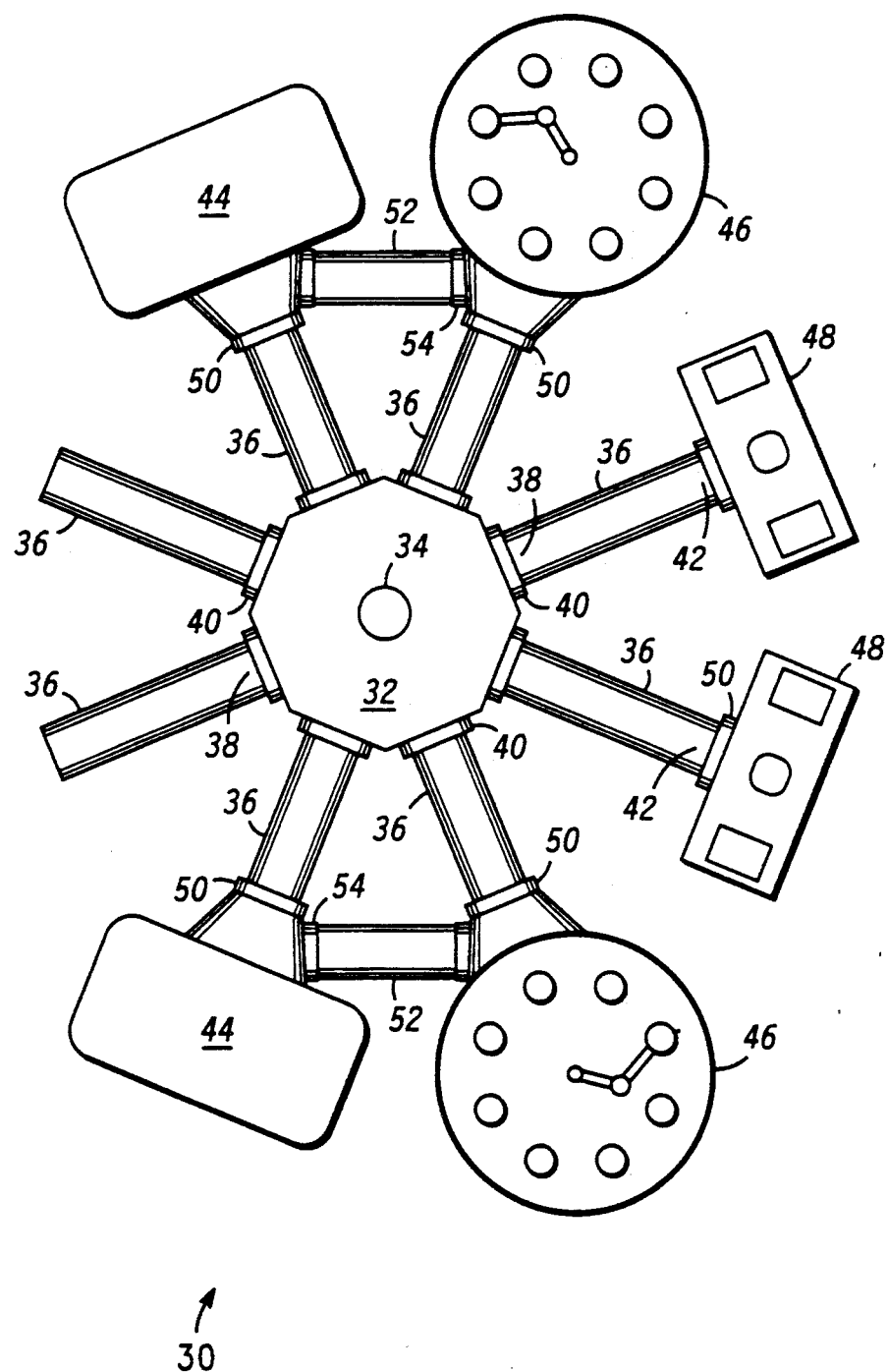
FIG. 2 is a schematic view of a vacuum wafer transport and processing system in accordance with an embodiment of the present invention.

FIG. 2 depicts a schematic view of a vacuum wafer transport and processing system 30. System 30 includes a central vacuum chamber 32. A wafer pad 34 is disposed in central vacuum chamber 32 and serves to hold wafers therein. Wafer pad 34 may have vertical movement capabilities if required. Although wafer pad 34 is shown to be a single pad herein, it should be understood that wafer holding means having the capability of holding multiple wafers at a given time may be employed.

System 30 further includes a plurality of wafer transport arms 36 being coupled to central vacuum chamber 32 at their first ends 38 by valves 40. In addition to coupling first ends 38 of wafer transport arms 36 to central vacuum chamber 32, valves 40 operate to seal central vacuum chamber 32 from each wafer transport arm 36. Valves 40 will further allow a wafer transport arm 36 to be removed from central vacuum chamber 32 while maintaining a vacuum in central vacuum chamber 32. This allows wafer transport arms 36 to be removed for maintenance and the like. Wafer transport arms 36 operate in a substantially horizontal manner. This allows for relatively easy alignment compared to robotic arms typically employed in cluster tools which are generally difficult to align. It should be understood, however, that it is also possible for wafer transport arms 36 to have vertical movement capabilities if desired. This would allow a wafer to be moved in a vertical direction by a wafer transport arm 36.

Wafer transport arms 36 further include second ends 42. Second ends 42 may be coupled to various wafer process chambers such as single process chambers 44, cluster tools 46 or wafer loaders 48. Second ends 42 may also be coupled to non-vacuum chambers or equipment such as steppers and the like so that lithography steps may be performed and upon completion, wafer 24 may be transported directly into system 30. Second ends 42 of wafer transport arms 36 are generally coupled to the various wafer process chambers by valves 50. Valves 50 enable the various process chambers to be sealed from wafer transport arms 36 and central vacuum chamber 32. Further, valves 50 allow for the various process chambers to be removed from wafer transport arms 36.

Certain wafer transport arms 36 of system 30 do not have their second ends 42 coupled to various process chambers. These wafer transport arms 36 may be employed for storage of wafers or for cooling steps and the like. It should be understood that wafer transport arms 36 employed for wafer storage, cooling steps and the like may also be coupled to chambers that may be used for storage or cooling.

Interchamber wafer transport arms 52 are disposed between single process chambers 44 and cluster tools 46. Interchamber wafer transport arms 52 are coupled to single process chambers 44 and cluster tools 46 by valves 54. Valves 54 enable single process chambers 44 and cluster tools 46 to be sealed from each other as well as from interchamber wafer transport arms 52. Interchamber wafer transport arms 52 allow wafers to be transported directly between various process chambers. Since wafers 24 do not always have to be transported through central vacuum chamber 32, interchamber wafer transport arms 52 allow throughput to be increased. It should be understood that interchamber wafer transport arms 52 need not always be disposed between single process chambers 44 and cluster tools 46. Depending upon the specific design of the vacuum wafer transport system, they may be arranged between chambers or elements as desired.

As shown herein, the wafer process chambers include wafer loading chambers 48. Wafer loading chambers 48 are sealed from the rest of system 30 by either valves 40 or 50 for the wafers to be loaded in. The wafers may be loaded into wafer loading chambers 48 either singly or in cassettes. Once the wafers have been loaded, wafer loading chambers 48 are pumped down to the desired vacuum pressure, typically that of central vacuum chamber 32. An internal transport mechanism of wafer arm 36 then retrieves a wafer from wafer loading chambers 48 and transports it to wafer pad 34 in central vacuum chamber 32. Another wafer transport arm 36 will then transport the wafer from wafer pad 34 into storage, a single process chamber 44 or a cluster tool 46.

Once a wafer or the desired amount of wafers have been placed in either a single process chamber 44 or a cluster tool 46, it is sealed from central vacuum chamber 32 by either valves 40, 50 or a valve (not shown) internal to either single process chamber 44 or cluster tool 46 and the desired process step or steps may be performed. Once the desired process step or steps have been performed, sealed valves 40, 50 or internal valve (not shown) are opened and wafer transport arms 36 transport wafers from either the single process chambers 44 or the cluster tools 46 back to wafer pad 34 of central chamber 32. The wafer or wafers may then be transported into other wafer transport arms for storage or into other process chambers for further processing or back to wafer loading chambers so that they may be removed from system 30. If interchamber wafer transport arms 52 are employed, they may be utilized to transport wafers between the various chambers as desired.

As another feature of the present invention, it is desirable to place chambers (not shown) between portions of wafer transport arms 36. This allows easier evacuation when portions of the system are evacuated because there is less volume to exhaust. This would be especially desirable for going between vacuum and non-vacuum steps such as from lithography steps to one of many vacuum processing steps. This would also be desirable for loading and unloading wafers. It should be understood that wafer transport arms 36 and interchamber wafer transport arms 52 may be of variable length depending upon specific applications. It is also possible to employ various wafer transport arms 36 at angles so that desired floorplans may be obtained. For example, it would be highly desirable to have a pair of wafer transport arms 36 extending to and from a small auxiliary chamber in different directions.

Thus it is apparent that there have been provided, in accordance with the invention, a vacuum wafer transport and processing system and method which meet the objects and advantages set forth above. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A vacuum wafer transport and processing system comprising:

a central vacumm chamber;

wafer holding means disposes in said central vacuum chamber;

a plurality of wafer transport arms to transfer wafers to and from said central vacuum chamber, each having a first end coupled to said central vacuum chamber and a second end; and a plurality of wafer process chambers coupled to said second ends of at least some of said plurality of wafer transport arms.

2. The system of claim 1 wherein interchamber wafer transport arms are disposed between various members of the plurality of wafer process chambers.

3. The system of claim 1 wherein first valve means are disposed between the central vacuum chamber and the first ends of the plurality of wafer transport arms, said first valve means serving to seal said central vacuum chamber from said wafer transport arms and also to enable removal of said wafer transport arms from said central vacuum chamber while maintaining a vacuum therein.

4. The system of claim 3 wherein second valve means are disposed between the second ends of at least some of the wafer transport arms and the plurality of wafer process chambers, said second valve means serving to seal said wafer process chambers during processing and also to seal said wafer process chambers so that they may be removed from said wafer transport arms while maintaining a vacuum therein.

5. The system of claim 4 wherein wafer holding means are vertically movable.

6. The system of claim 4 wherein the plurality of wafer transport arms are vertically movable.

7. The system of claim 4 wherein members of the plurality of wafer transport arms are employed for wafer storage.

8. The system of claim 4 wherein the plurality of wafer transport arms are of varying lengths.

9. The system of claim 4 wherein non-vacuum equipment is coupled to said system.

10. The system of claim 4 wherein evacuation chambers are disposed between portions of members of the plurality of wafer transport arms.

11. A vacuum wafer transport and processing system comprising:

a central vacuum chamber;

wafer holding means disposed in said central vacuum chamber;

a plurality of wafer transport arms to transfer wafers to and from said central vacuum chamber, each having a first end and a second end;

first valve means disposed between and coupling said central vacuum chamber and said first ends of said plurality of wafer transport arms, said first valve means serving to seal said central vacuum chamber from said wafer transport arms and also to enable removal of said wafer transport arms from said central vacuum chamber while maintaining a vacumm therein;

a plurality of wafer process chambers coupled to said second ends of at least some of said plurality of wafer transport arms; and second valve means disposed between and coupling said second ends of at least some of said wafer transport arms and said plurality of wafer process chambers, said second valve means serving to seal said wafer process chambers during processing and also to seal said wafer process chambers so that they may be removed from said wafer transport arms while maintaining a vacuum therein.

12. The system of claim 11 wherein one or both of said wafer holding means and the plurality of wafer transport arms are vertically movable.

13. The system of claim 11 wherein interchamber wafer transport arms are disposed between various members of the plurality of wafer process chambers.

14. The system of claim 12 wherein the plurality of wafer transport arms are of varying lengths.

15. The system of claim 12 wherein members of the plurality of wafer transport arms are employed for wafer storage.

16. The system of claim 12 wherein non-vacuum equipment is coupled to said system.

17. The system of claim 12 wherein evacuation chambers are disposed between portions of members of the plurality of wafer transport arms.

18. A method of transporting and processing wafers under vacuum comprising the steps of:

providing at least one wafer to be processed;

disposing said at least one wafer in a central vacuum chamber of a vacuum wafer transport and processing system, said system including wafer holding means disposed in said central vacuum chamber, a plurality of wafer transport arms to transfer said at least one wafer to and from said central vacuum chamber, each having a first end coupled to said central vacuum chamber and a second end, and a plurality of wafer process chambers coupled to said second ends of at least some of said plurality of wafer transport arms;

transporting said at least one wafer from said central vacuum chamber to a first of said plurality of process chambers via one of said plurality of wafer transport arms;

sealing said first of said plurality of after process chambers from said one of said plurality of wafer transport arms; performing a first process step on said at least one wafer in said first of said plurality of process chambers;

transporting said at least one wafer from said first of said plurality of process chambers to a second of said plurality of process chambers, sealing said second of said plurality of process chamber and performing a second process step on said at least one wafer; and removing said at least one wafer from said second of said plurality of wafer process chambers following the second process step.

19. The method of claim 18 further including employing an interchamber wafer transport arm to transport said at least one wafer directly between the first and second of the plurality of process chambers.

20. The method of claim 18 further including emloying members of the plurality of wafer transport arms for wafer storage.

21. The method of claim 18 further including performing non-vacuum steps on the at least one wafer by equipment coupled to the vacuum wafer transport and processing system.

* * * * *